(12) United States Patent
Guldi et al.

(10) Patent No.: US 7,772,867 B2
(45) Date of Patent: Aug. 10, 2010

(54) STRUCTURES FOR TESTING AND LOCATING DEFECTS IN INTEGRATED CIRCUITS

(75) Inventors: Richard L. Guldi, Dallas, TX (US); Toan Tran, Rowlett, TX (US); Deepak A. Ramappa, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 187 days.

(21) Appl. No.: 12/037,687

(22) Filed: Feb. 26, 2008

(65) Prior Publication Data

US 2009/0212793 A1    Aug. 27, 2009

(51) Int. Cl.
*G01R 31/02* (2006.01)
(52) U.S. Cl. .................... 324/763; 324/765; 324/158.1; 257/48
(58) Field of Classification Search ................. 324/763, 324/765, 158.1; 257/48
See application file for complete search history.

(56) References Cited

U.S. PATENT DOCUMENTS

| 4,743,841 | A  | * | 5/1988 | Takeuchi ................. 327/763 |
| 7,068,058 | B2 | * | 6/2006 | Park et al. ................ 324/763 |
| 7,403,026 | B2 | * | 7/2008 | Kerber et al. ............. 324/763 |
| 7,443,186 | B2 | * | 10/2008 | Strid et al. ............... 324/763 |
| 2006/0282725 | A1 | * | 12/2006 | Kerber et al. ............. 714/724 |
| 2007/0278557 | A1 | * | 12/2007 | Chen et al. ............... 257/315 |

* cited by examiner

*Primary Examiner*—Ha Tran T Nguyen
*Assistant Examiner*—Richard Isla Rodas
(74) *Attorney, Agent, or Firm*—Warren L. Franz; Wade J. Brady, III; Frederick J. Telecky, Jr.

(57) ABSTRACT

A method for detecting defects during semiconductor device processing can include providing a substrate having a semiconductor comprising layer with electrically isolated application and test circuits are formed thereon, directing an electron current inducing beam to the test circuit; measuring a current between the first and the second contact pads in the test circuit; determining an electron beam induced current (EBIC); and identifying one or more defect locations in the test circuit based on the EBIC and a location of the electron beam corresponding to the EBIC. A test circuit can include a plurality of semiconductor devices connected in parallel, a first contact pad coupled to a first terminal of the semiconductor devices, and at least a second contact pad coupled to a substrate terminal associated with the semiconductor devices.

17 Claims, 6 Drawing Sheets

STRUCTURES FOR TESTING AND LOCATING DEFECTS IN INTEGRATED CIRCUITS

FIELD OF THE INVENTION

The present invention is related to the field of fabricating and testing semiconductor devices, and more particularly to methods and structures for E-beam testing of systematic and random defects during semiconductor device fabrication.

BACKGROUND

Competitive yield learning requires defect characterization and rapid resolution of systematic and random defect issues during early development of semiconductor devices. For example, E-beam inspection tools provide high sensitivity assessment as well as the ability to localize defects for cross-sectioning. Hence, test structures have been used with E-beam inspection tools to characterize known systematic defect issues occurring in integrated circuits, such as contact-to-gate shorts, worm hole leakage paths, contact printing issues, and sparse hole processing.

E-beam testing has also been used for inspection of random defects such as dislocations and other localized current leakage paths on product wafers, and has provided a means of quantifying dislocation and/or other defect densities with a short cycle time. Traditionally, dislocation inspections have been done using static random access memory (SRAM) structures. However, as process improvements are made, the SRAM cells become less sensitive indicators of the tendency to form dislocations. Furthermore, several types of defects cannot typically be detected using conventional E-beam techniques because of their location in the circuit. For example, dislocations and "pipes" (dislocations containing metal) occurring under gate electrodes and field dielectric regions typically go undetected using conventional E-beam testing. In general, such features typically result in leakage currents at level insufficient to result in a distinguishable contrast signal during a typical E-beam scan. Therefore, what is needed is a set of test structures for use with both E-beam and other defect detection techniques to allow detection and identification of dislocations, pipes, and other types of defects when conventional E-beam inspection techniques are ineffective.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

In a first embodiment of the present invention, a method for detecting defects during semiconductor device processing comprises providing a substrate having a semiconductor comprising layer formed thereon, where an application circuit and one or more test circuits are formed in or on the layer, and where the test circuits and the application circuit are electrically isolated from each other. The method further includes directing an electron current inducing beam to the test circuit, measuring a current between the first and the second contact pads in the test circuit, determining an electron beam induced current (EBIC), and identifying one or more defect locations in the test circuit based on the EBIC and a location of the electron beam corresponding to the EBIC. In the method, a test circuit can include a plurality of semiconductor devices connected in parallel, a first contact pad coupled to a first terminal of the semiconductor devices, and at least a second contact pad coupled to a substrate terminal associated with the semiconductor devices.

In a second embodiment of the present invention, an integrated circuit comprises a substrate having a semiconducting surface, and an application circuit formed in or on the surface, and one or more test circuits formed in or on the surface, the test circuits and the application circuit being electrically isolated from each other. Each of the test circuits comprises a plurality of semiconductor devices connected in parallel, a first contact pad coupled to a first terminal of the semiconductor devices, and at least a second contact pad coupled to a substrate terminal associated with the semiconductor devices.

In a third embodiment of the present invention, an integrated circuit comprises a substrate having a semiconducting surface, an application circuit formed in or on the surface, and at least one test circuit formed on and in the surface, where the test circuit and the application circuit are electrically isolated. The test circuit comprises a plurality of MOSFET transistors arranged on the substrate in series along a first direction, where the MOSFET transistors have gate electrodes formed in a second direction orthogonal to the first direction and active regions having one or more stress increasing design features, the active area stress increasing design features comprising one or more active region extensions extending from a portion of an edge of the active regions in a third direction, where the third direction has at least one directional component orthogonal to the first direction, and where substrate or body contacts for the MOSFET transistors are within 500 µm of the active regions of the transistors.

DETAILED DESCRIPTION OF THE DRAWINGS

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The inventors have discovered that, while E-beam inspection tools are useful for the detections of various types of defects, some types of low leakage current inducing defects, such as dislocations, pipes, precipitates, and other structural defects, often cannot be detected using conventional E-beam scans. In particular, the inventors have discovered that while dislocations can increase the source/drain area of a device in an integrated circuit and can result in increased leakage, insufficient leakage current typically exists to cause gray-level variations (GLV), the intensity of collected electrons in an area, during an E-beam scan. Consequently, E-beam inspection tools typically cannot locate and identify such defects including dislocations and pipes occurring under dielectric layers, such as field dielectric and gate dielectric regions.

Accordingly, one aspect of the present invention provides new methods, separately or in combination with E-beam inspection methods, for locating and identifying defects during semiconductor device fabrication. The term "Semiconductor devices" as used herein can include any type of device fabricated on a substrate having at least one semiconductor comprising layer and any other number of layers. A "semiconductor comprising layer" can include crystalline, polycrystalline, and amorphous layers made from one or more semiconducting materials. By way of example and not limitation, semiconductor devices can include metal-insulator/oxide-semiconductor devices (including transistors and capacitors), diodes, bipolar transistors, biosensor devices, electrical or mechanical sensor devices, photo-electronic devices, microelectromechanical systems (MEMS), solar cell devices, or any combination thereof. Photo-electronic devices can include, by way of example and not limitation, bio-electronic devices, bio-photonic devices, optical electronic devices, and combinations thereof. In particular, some embodiments of the present invention provide for determining the location of a defect by inducing a leakage current using an incident high energy beam and measuring the induced current levels, including induced currents associated with defects normally insufficient to cause variations in GLV during E-beam inspection. Another aspect of the present invention provides test circuits specifically configured to allow increased sensitivity in the measurement of the induced currents. Although the embodiments below will be discussed in terms of using conventional E-beam scans with one type of specialized E-beam inspection technique, electron beam induced current (EBIC), to induce and measure low current leakage levels due to dislocations, pipes and other defects, the invention is not limited to the use of an electron beam to induce current in the test circuits. One of ordinary skill in the art will readily recognize that any type of energetic beam sufficient to generate electron-hole pairs in semiconductor layers of the test circuits can also be used. For example, and not limitation, energetic beam sources can include laser emitters, x-ray sources, charged (proton) and uncharged (neutron) particle sources, or any combination thereof.

As described above, one aspect of the present invention provides a test circuit configured to improve sensitivity in the detection of low leakage current levels due to dislocations, pipes, and other defects using EBIC or other high energy beam-based techniques. In particular, in order to enhance detection of such defects, the test circuit can be designed to include multiple parallel leakage paths to increase sensitivity to dislocations in a given area of the integrated circuit. Furthermore, sensitivity can also be increased in the test circuit by including localized substrate grounding or local body contacts for the devices in the test circuit and/or local contact pads directly coupled to only the terminals of the devices in the test circuits.

Figure 1:
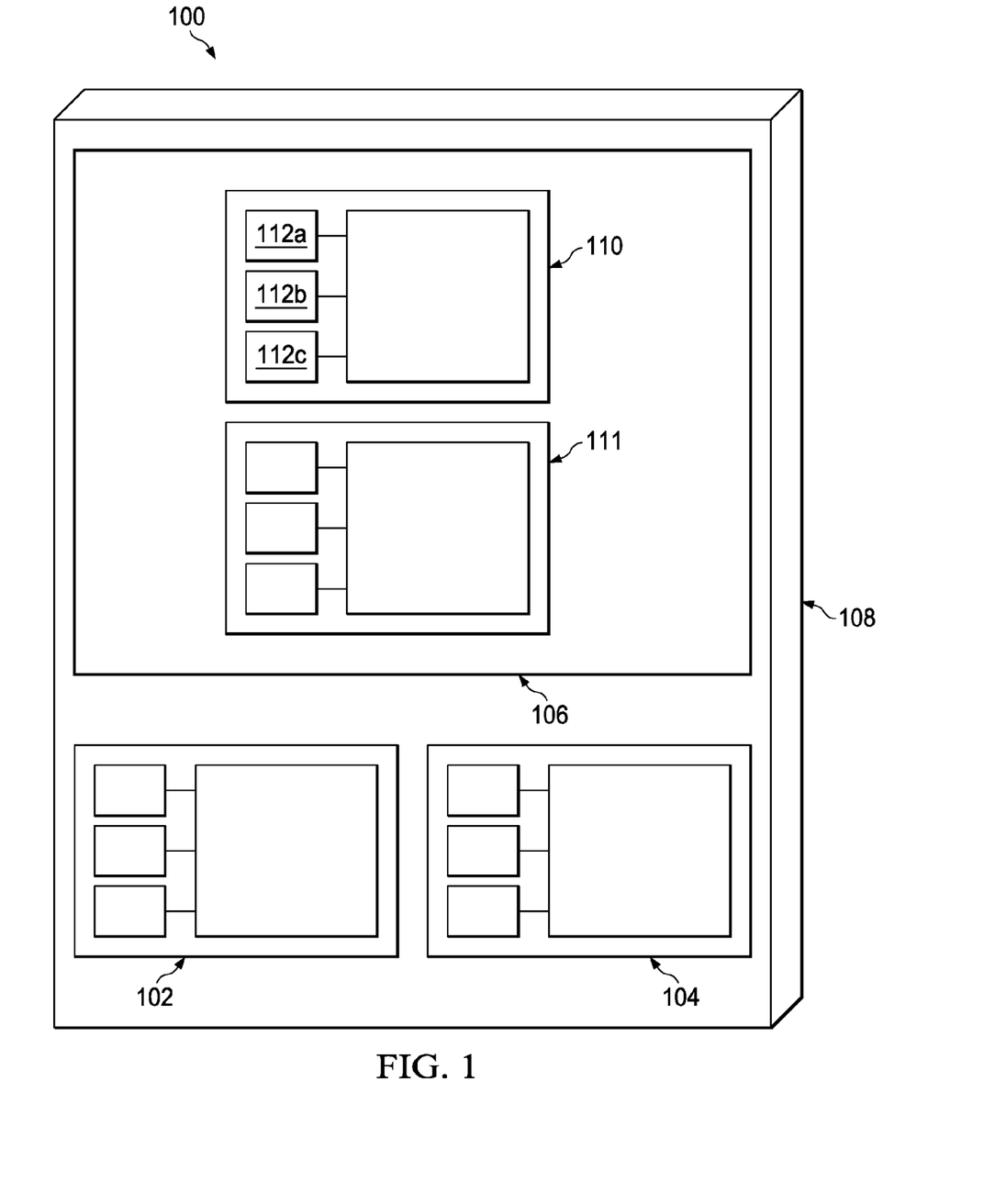
FIG. 1 is a schematic view of an exemplary integrated circuit including test circuits according to an embodiment of the present invention.

As shown in FIG. 1, various embodiments of the present invention can include providing an integrated circuit 100 including one or more test circuits 102, 104, 110, 111 that can be formed on a semiconductor surface of a substrate 108. In FIG. 1, test circuits 102, 104 are shown as being formed alongside an application circuit die 106 formed on the semiconductor surface of a substrate 108, such as in a scribe line. However, the invention is not limited in this regard and alternatively, or in combination with test circuits 102, 104, one or more test circuits 110, 111 can also be formed within the application circuit die 106, as shown in FIG. 1. In the various embodiments, the circuit layout for the application circuit die is not limited to solely circuit layouts for products. In some embodiments, the application circuit die can also include a test or development layout for proving processes, circuits, products, or any combination thereof. For example, during technology or process development, a test circuit can be placed within an application die for testing the process flow to understand leakage or other emerging problems. However, after the process flow is mature or is otherwise proven, a test circuit can be placed in the scribe lines of product wafers to diagnose process flow issues during production or manufacturing stages. In either configuration, the test circuits 102, 104, 110, and 111 can be configured to be electrically isolated from the functional circuits in the application circuit die. That is, an electrical signal in any of the test circuits 102, 104, 110 and 111 produces no reaction in application circuit die 106, and vice versa.

Also as shown in FIG. 1, any number of test circuits can be included in the integrated circuit 100. Although multiple test circuits can be identically configured, in some embodiments, each of the test circuits can be configured to provide varying sensitivity to dislocations, pipes, and other defects. For example, in some embodiments, a first test circuit can be configured to closely follow the design rules and conventions for the process technology associated with the fabrication of the application circuit die. However, at least one second test circuit can be configured to enhance the formation of dislocations. That is, design elements can be included in the second test circuit that result in process conditions that are more favorable to the formation of dislocations as compared to those in the first circuit. However, the invention is not limited in this regard and any test circuits in the integrated circuit can include one or more design elements configured to aggravate the formation of defects, such as dislocations.

In various embodiments of the present invention, a test circuit included in an integrated circuit can include a plurality of semiconductor devices connected in parallel. For example, in some embodiments a test circuit can include a plurality of transistors connected in parallel. That is the active terminals (source, drain, and gate) of the transistors, as well as substrate or body contacts associated with the transistors can be commonly coupled to probe or contact pads. That is, the gates of the transistors in the test circuit can be coupled to a first common contact pad. Similarly, the source and drains of the transistors in the test circuit can also be coupled to a second common contact pad and the substrate or body contacts for the transistors can be coupled to a third common contact pad. By connecting these multiple transistors in parallel, increased sensitivity can be provided during a single test, as any induced current by any transistor in the test circuit can be measured by probing a single set of contact pads. However, the use of parallel transistors is presented by way of example and not limitation. In some embodiments, the test circuit can be configured to operate with any plurality of semiconductor devices having at least two terminals. For example, a diode or a bipolar transistor can have one or more dislocations at a p-n junction. Although such a defect would alter the shape of the resulting junction, at least electrically, typically the resulting leakage current can be insufficient to result in a distinguishable GLV during a conventional E-beam scan. Additionally, any other types of devices can be used in the test circuit, including, but not limited to electronic or mechanical sensor devices, solar cell devices, microelectromechanical systems (MEMS), biosensor devices, bio-electronic or bio-photonic devices, optical electronic devices, or any combinations thereof. As used herein, "bio-electronic" and "bio-photonic" devices refer to devices produced using one or more bioengineering process techniques.

As shown in FIG. 1, the test circuits 102, 104, 110, 111 can include at least two pads for probing the terminals of the devices connected in parallel. For example, the test circuits 102, 104, 110, and 111 can include multiple MOSFET devices connected in parallel and three contact pads 112a, 112b, 112c can be associated with each of the terminals (gate, body, and source/drain). Although the embodiments described herein are limited to those associated with the terminals of a MOSFET device, it should be apparent to one of ordinary skill in the art that any number of pads can be included and can be used to contact devices having any number of terminals. Furthermore, in some embodiments, groups of devices within a test circuit can be commonly connected in groups and sets of contact pads can be provided to allow for addressable portions of the test circuits. Additionally, groups of types of devices can also be arranged in the test circuit and accordingly contacted using one or more sets of contact pads.

Embodiments of the present invention are also not limited to including only design elements that enhance the formation of dislocations, pipes, and other defects. In some embodiments of the present invention, the test circuits on an integrated circuit can also be formed using processes that also enhance the formation of dislocations, pipes, or other defects. Therefore, test circuits can be formed using the same process flow as used to form the field dielectric in the application die and/or using an alternate process to increase sensitivity of the test circuits to electrical leakage. For example, field dielectric high stress formation processes that enhance the formation of dislocations can be used for the test circuit. For example, in a process flow including a shallow trench oxide, a high stress liner dielectric or a high stress trench field oxide can be used to enhance the stress in the test circuit. Similar, any other type of isolation processes, such as LOCOS or moat isolation, can be adjusted to enhance stress in the test circuit.

Figure 2:
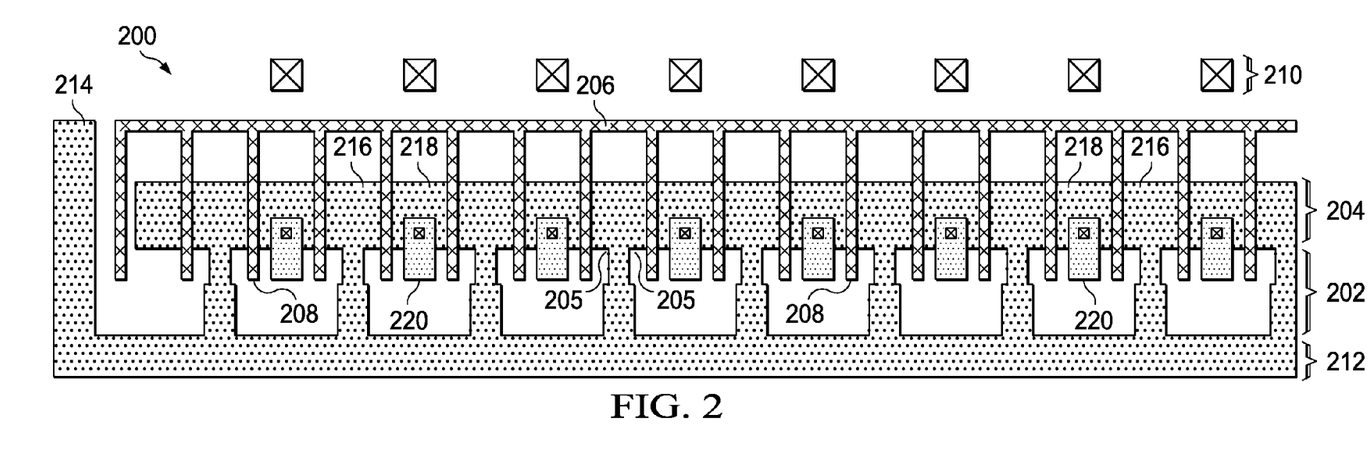
FIG. 2 is an exemplary layout of a portion of a test circuit including low stress gate conductor features according to an embodiment of the present invention.
Figure 3:
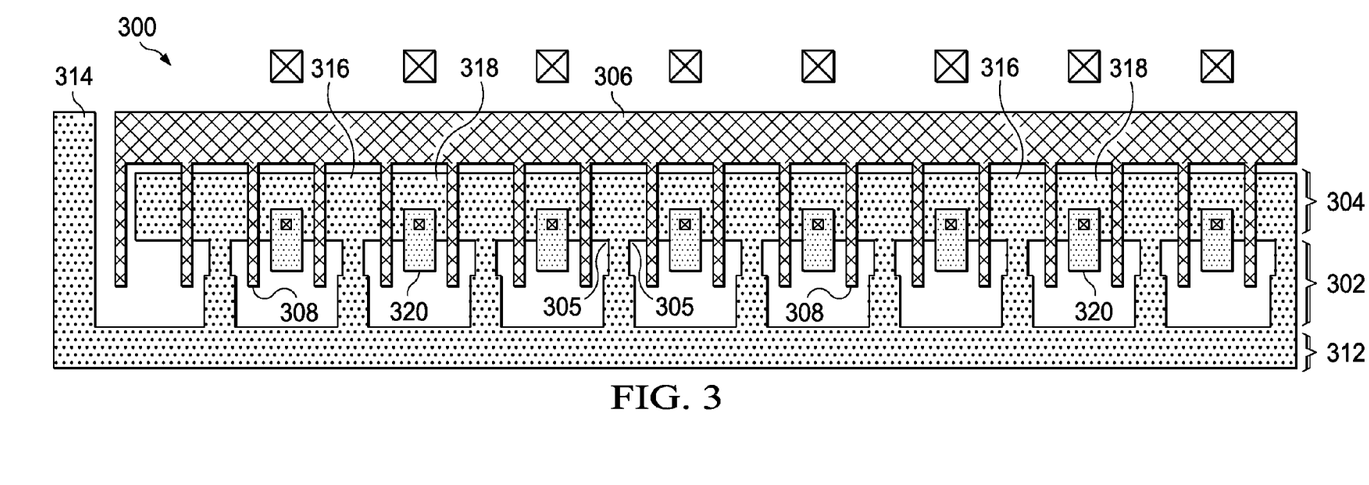
FIG. 3 is another exemplary layout of a portion of a test circuit including high stress gate conductor features according to an embodiment of the present invention.

FIGS. 2 and 3 illustrate a portion of exemplary semiconductor test circuit layouts 200 and 300 for use with both E-Beam and EBIC (or any other high energy beam) inspection tools according to the various embodiments of the present invention. The test circuit layouts 200 and 300 can include one or more design elements that accentuate layout factors that enhance the generation of dislocations, pipes, and other defects, as previously discussed. A first design element can comprise active region extensions 202, 302 extending from an edge of the active regions 204, 304 in a direction having at least one directional component orthogonal to the edge of the active regions 204, 304 in the test circuits 200, 300 defining the source and drains of the transistors therein. Such extensions 202, 302 can result in stress enhancing corners 205, 305 of the active regions, due to resulting stress during and after the formation of the thick field dielectric in adjoining regions.

A second design element, shown in FIG. 3, can comprise enlarged gate conductor regions 306 (i.e., having a width greater than 1000 nm) located in proximity to the active regions 304. For example, a gate conductor to active region spacing of between 10% and 100% of the minimum design rule spacing can result in enhanced stress along the portions of the active regions 304 adjacent to gate conductor 306. Consequently, this will typically result in greater stress along the edge of active region 304 than the configuration of the gate conductor 206 in circuit 200. In such embodiments, stress is enhanced in the active regions 304 because typical gate conductor materials generally have an expansion coefficient different from that of the underlying semiconductor surface, including the active regions 304. Therefore, if an enlarged area gate conductor 306 is deposited at elevated temperature, the differential expansion of the large area of gate conductor 306 is translated to the semiconductor surface below. As used herein, an "enlarged gate conductor" refers to a gate conductor having at least one dimension greater than the design rule minimum. For example, in some embodiments, the width of an enlarged gate conductor 306, as shown in FIG. 3, can have a width up to 1 μm to overlap a substantial portion of a field dielectric region and enhance stress in a silicon portion below. However, the invention is not limited in this regard and a dimension of the enlarged gate conductor can be selected or adjusted to provide a particular amount of stress for a particular test circuit. In the case where such gate conductors are placed adjacent to active regions 304, any stress already present in the active regions 304 is enhanced. Another design element can comprise forming multiple gate electrodes 208, 308 in proximity to each other, resulting in localized enhanced stress favoring the formation of dislocations, pipes, and defects in the active regions, including defects under the gate electrodes.

As shown in FIGS. 2 and 3, the active regions 204, 304 can comprise one or more commonly formed active regions. That is, at the layout level, a single region can be used to define the source and drain regions along a single axis for the multiple transistors associated with each of the gate electrodes 208, 308. This can not only allow closer placement of the parallel connected devices, but the periodicity of the gate electrodes 208, 308 in the common regions 204, 304 can be used to further increase stress in the region. Similarly, the use of a common active region 204, 304 also allows for a closer placement of the active region extensions 202, 302 and for adjustment of their periodicity. Accordingly, to provide varying sensitivity in the test circuits 200 and 300, the active region extensions 216, 316 and/or gate electrodes 208, 308 can be placed in various periodic patterns to adjust the conditions for the formation of dislocations, pipes, or any other defects in each of the test circuits. Although any periodic arrangement of devices can be used, the size and spacing for devices in the test circuit and an application die can be the same to ensure to allow proper control of feature sizes in the test circuits over the entire wafer. However, in some embodiments, stress can be further enhanced by using deviating from minimum spacing allowed by the design rules for the test circuit. For example, in a test circuit including a plurality of MOSFET devices, the size of gate electrodes can be increased to enhance stress, resulting in enhanced stress, as discussed for the wider gate conductor 306 in FIG. 3.

The test circuits 200, 300 can also include substrate or body contacts 210 and 310 in proximity to active regions 204, 304. The substrate or body contacts 210, 310 can be formed according to the required doping for the active regions and the doping of the semiconductor surface of the substrate within which the test circuits are disposed. For example, for test circuits including n-channel MOSFET (NMOS) devices formed on a lightly doped p-type surface, the body contact can be formed by adding additional p-type dopants to a region of the p-type surface to form a low resistance contact. Conversely, to form p-channel MOSFET (PMOS) devices on the p-doped surface, an n-well may be formed in the surface and additional n-type dopants added to a region of the n-well to form a low resistance contact. Body contacts can be similarly formed for NMOS and PMOS devices formed on n-doped surfaces.

The test circuits 200, 300 can further include one or more second common active regions 212, 312 for coupling the various source and/or drain regions formed during processing. For example, as shown in test circuits 200 and 300, the extensions 202, 302 can be used to couple the active regions 204, 304 to the second common active regions 212, 312. Consequently, the second common active region can be coupled to a bus or pad 214, 314 to allow the devices in the test circuits 200, 300 to be monitored without having to directly probe each device in the test circuits 200, 300.

Figure 4:
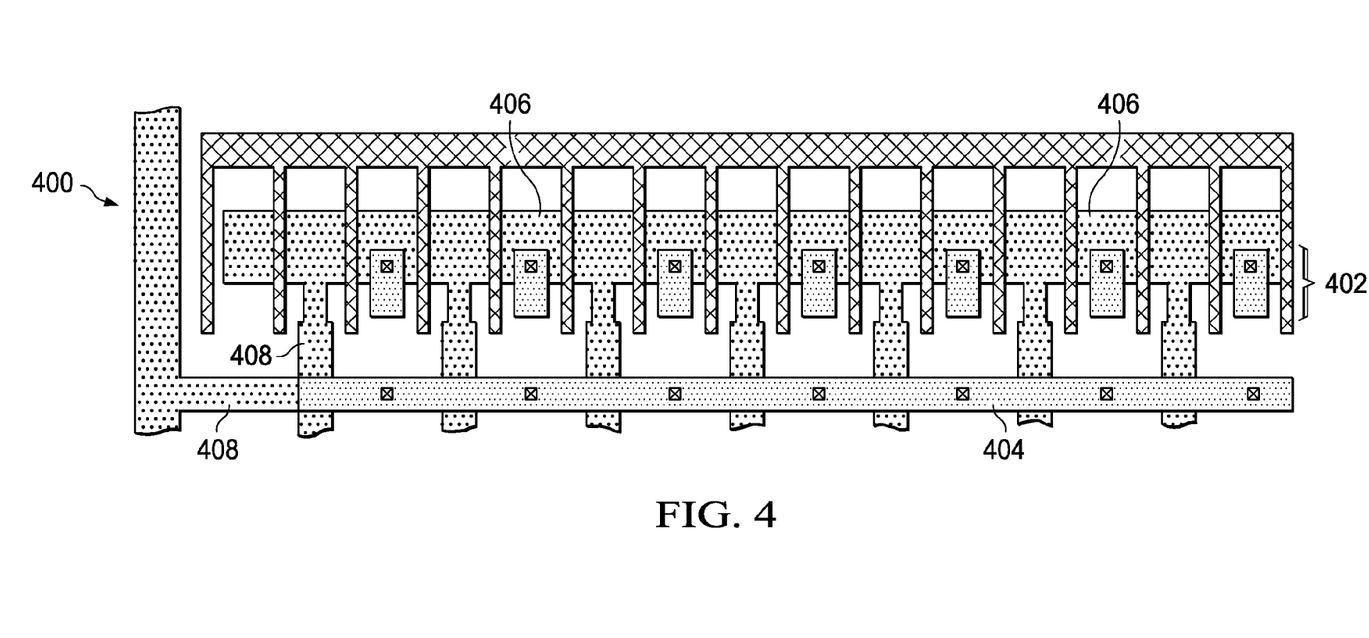
FIG. 4 is an exemplary layout of a transistor portion including high stress gate conductor features of a test circuit showing interconnection of isolated active regions according to an embodiment of the present invention.

As previously described, the test circuits 200, 300 can be formed together with the associated application circuit die. Consequently, the formation of gate electrodes 208, 308 during conventional processing results in adjacent active area portions 216, 316 and 218, 318, respectively, being isolated from each other due to the gate electrodes blocking the source/drain implant. Therefore, because the extensions 202, 302 are connected only to regions 216, 316, the portions 218, 318 cannot be contacted directly. Although induced current can be monitored using only portions 216, 316, increased sensitivity to the induced currents can be provided by additionally probing isolated regions 218, 318. Accordingly, in some embodiments, contacts 220, 320 can be used to contact the isolated regions 218, 318 and couple them to the second common active regions 212, 312 or to a bus or pad 214, 314, using the interconnect levels of the integrated circuit. For example, as shown in FIG. 4, contacts 402 and 404 can be used to contact the isolated regions 406 and the second common active region 408 using the metal interconnect layers of the integrated circuit.

As previously described, the body or substrate contacts in the test circuits can be placed in proximity to the active areas to increase sensitivity. The inventors have discovered that in some cases, induced currents due to dislocations, pipes, and other defects can be at such a low level, that a substrate or body contact of the device needs to be in proximity to the defect to have sufficient sensitivity to measure the induced current. For example, the inventors have generally found that for some process technologies, a distance of less than 500 nm is required to detect a current signal during EBIC testing. However, in some embodiments the distance can be between 5 and 50,000 nm, depending on the process technology.

Figure 5:
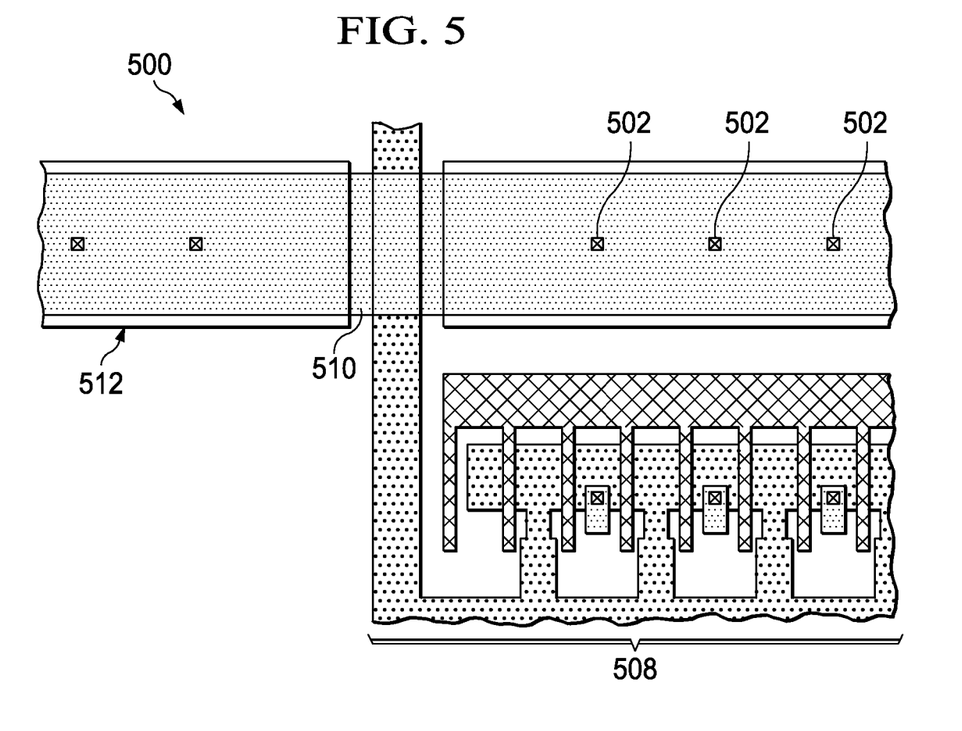
FIG. 5 is an exemplary layout of a transistor portion including high stress gate conductor features of a test circuit showing connection of body contacts to a contact pad according to an embodiment of the present invention.

To provide increased sensitivity, some embodiments of the present invention provide contacting the semiconductor surface with substrate or body contacts for the transistors in proximity to the transistors formed in the active areas, as shown in FIGS. 2, 3 and 5. For example, for a group of transistors 508 arranged along a common direction or an axis, as shown in FIG. 5, the contacts 502 can be placed along a same direction or axis. These contacts 502 can be coupled to a common conductor line 510 out to a contact pad 512. Accordingly, if a dislocation is generated in at least one of devices 508, at least one of the contacts 502 can be in sufficient proximity to allow detection at contact pad 512 of the induced current during EBIC testing.

In the various embodiments, maximum sensitivity during EBIC testing can be provided by including as many contacts as possible. For example, a substrate or body contact can be placed adjacent to every active area region formed in the test circuit. However, the invention is not limited in this regard and any number and placement of substrate or body contacts can be used. For example, the number of devices can be increased and the number of substrate or body contacts can be decreased. In such embodiments, even though sensitivity is reduced by incorporating few substrate or body contacts, the reduction in sensitivity can be compensated, at least in part, by the incorporation of additional parallel paths (i.e., more devices).

Figure 6:
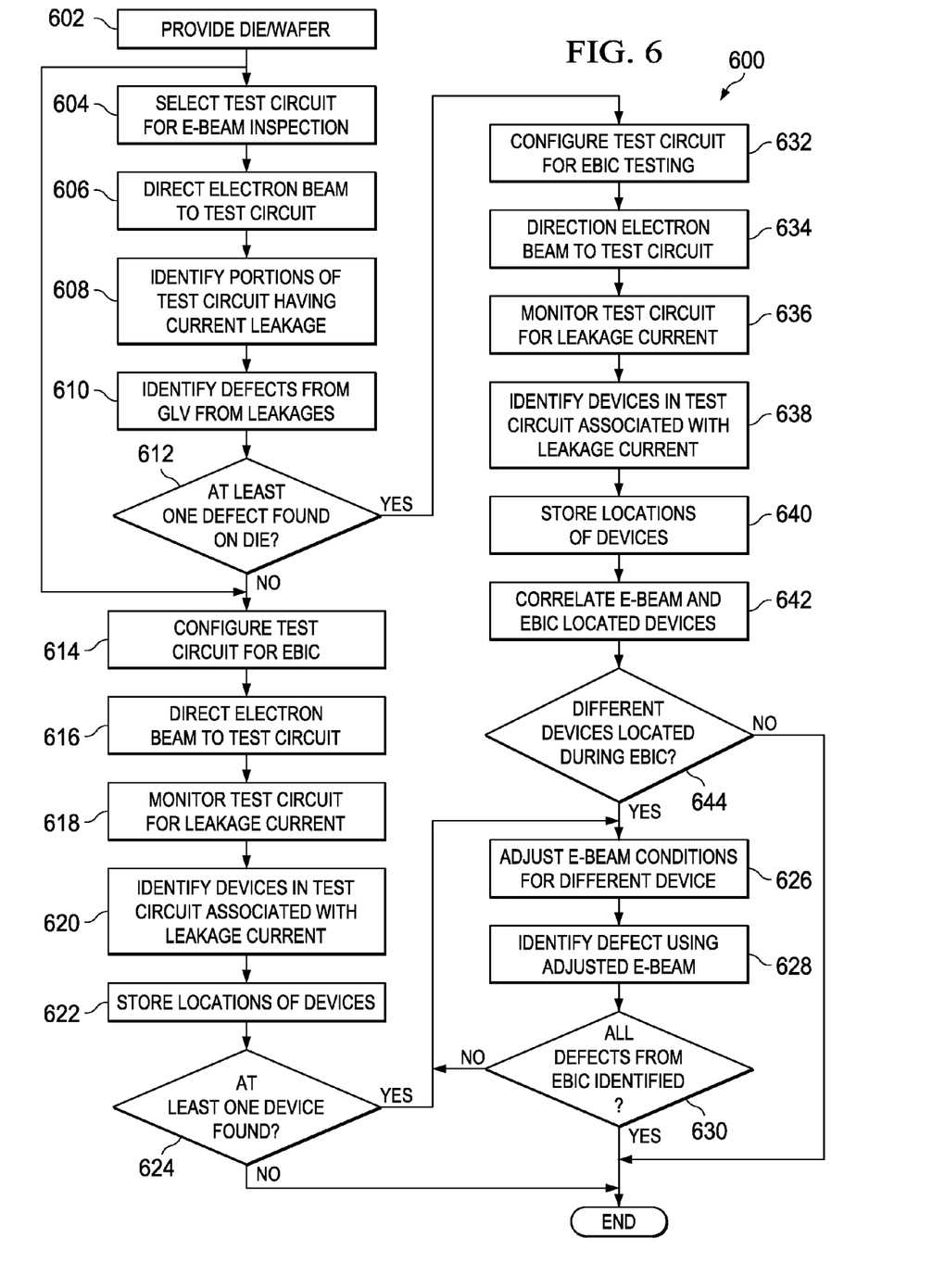
FIG. 6 is a flowchart of exemplary steps of a method for detecting and identifying defects integrated circuits according to embodiments of the present invention

Accordingly, by using test circuits according to the embodiments of the present invention with EBIC (or other high energy beams), E-beam inspections can be supplemented with identification of dislocations, pipes, and other defects normally undetected during E-beam inspection. For example, FIG. 6 is a flowchart illustrating steps in an exemplary method 600 for locating and identifying defects in an integrated circuit using EBIC and E-beam techniques with a test circuit according to the various embodiments of the present invention.

The exemplary method 600 can begin with step 602, in which an integrated circuit is provided, which includes one or more test circuits, such as the integrated circuit 100 shown in FIG. 1. The integrated circuits can be provided as either individual dies or as dies on a wafer. The method 600 can then continue by selecting the test circuit on the die to be inspected using conventional E-beam techniques in step 604. An electron inspection beam can then be directed to the selected test circuit in step 606. As described below, the electron inspection beam can be used to scan the test circuit to expose the entire surface of the test circuit to electrons. Afterwards, conventional E-beam techniques can be used to identify locations of leakage currents in step 608 and particular devices in the test structure can be identified in step 610 that are believed to include defects.

Once the test circuit is scanned, the method 600 can determine if at least one defect has been identified in the test circuit in step 612. If no defects are found in the scanned test circuit in step 612, then in step 614, the test circuit can be selected for EBIC testing. One of ordinary skill in the art will also recognize that EBIC testing can also be performed directly after step 604. For example, if the tester is searching specifically for defects that cannot be detected during the convention E-beam inspection, the EBIC testing can be performed first to identify test circuits including possible defects. Therefore, in step 614 the die including the suspect test circuit can be prepared for EBIC inspection by contacting two or more contact pads in the test circuit. In some embodiments, the temperature of the die or wafer can be lowered so that other noise sources, such as generation-recombination noise, can be reduced significantly. Once the test circuit is ready for EBIC testing in step 614, in step 616 an electron current inducing beam can be directed to the test circuit and the pads can be monitored in step 618 for current, signaling induced current due to defects. If the portion of the test circuit current being scanned generates a current due to the presence of a defect, such as a dislocation or a pipe, the portion can be identified in step 620 as containing a defect and the location of the defect in the test circuit can be stored in step 622 for correlation with subsequent E-beam scans.

If no defects are found by EBIC in step 624, the inspection can end. However, if at least one defect is found in the test circuit in step 624, then an E-beam inspection of the test circuit can be performed. Consequently, an E-beam scan can be performed in the locations stored in step 620 in step 626. However, because some types of defects are not detectable by conventional E-beam scans, the E-beam conditions can be varied during step 626 until the defect(s) located by EBIC testing can be imaged by varying a current, a voltage, or a temperature during the E-beam scan to produce sufficient leakage to generate distinguishable GLV's of the defect. In some embodiments, the E-beam conditions can be adjusted after identifying each defect. However, in other embodiments, the E-beam conditions can be adjusted to identify the first defect and the same conditions can be used for identifying other defects. The GLV's generated in step 626 can then be used to identify the defect in step 628. If other defects in the test circuit need to be identified in step 630, steps 626 and 628 can be repeated for each defect identified during EBIC testing until all defects are identified. However, in some embodiments, rather than readjusting E-beam conditions after each defect, the E-beam conditions can be adjusted for the first defect location specified by the EBIC inspection and the same conditions can be used for identification of all other defects located by EBIC inspection.

As previously described, EBIC (or other high energy beam) testing can also be used after an E-beam inspection to locate additional defects. That is, conventional E-beam techniques can be used, as in steps 604-610 to identify gross defects in the test circuit. However, even if gross defects are found in step 612, additional EBIC testing can be used to identify other possible defects in the test circuits. Therefore, after E-beam inspection of a test circuit, the test circuit can be configured to EBIC testing in step 632, as previously described. Afterwards, as in steps 616-622, steps 634-640 can be performed to identify defects in the test circuit. During the EBIC testing in steps 634-640, some leakage currents can be generated that correspond to defects already identified during E-beam inspection. However, EBIC testing can also identify additional location(s) in the test circuit associated with additional undetected defects. Accordingly, once EBIC testing generates a list of locations in the test circuit associated with possible defects, the locations stored can be compared to the locations of defects already identified during E-beam testing in step 642. If any additional locations are identified in step 644, then steps 626-628 can be repeated, as previously discussed, to allow E-beam conditions to be adjusted to allow detection and identification of the EBIC-detected defects until all defects are identified.

Figure 7:
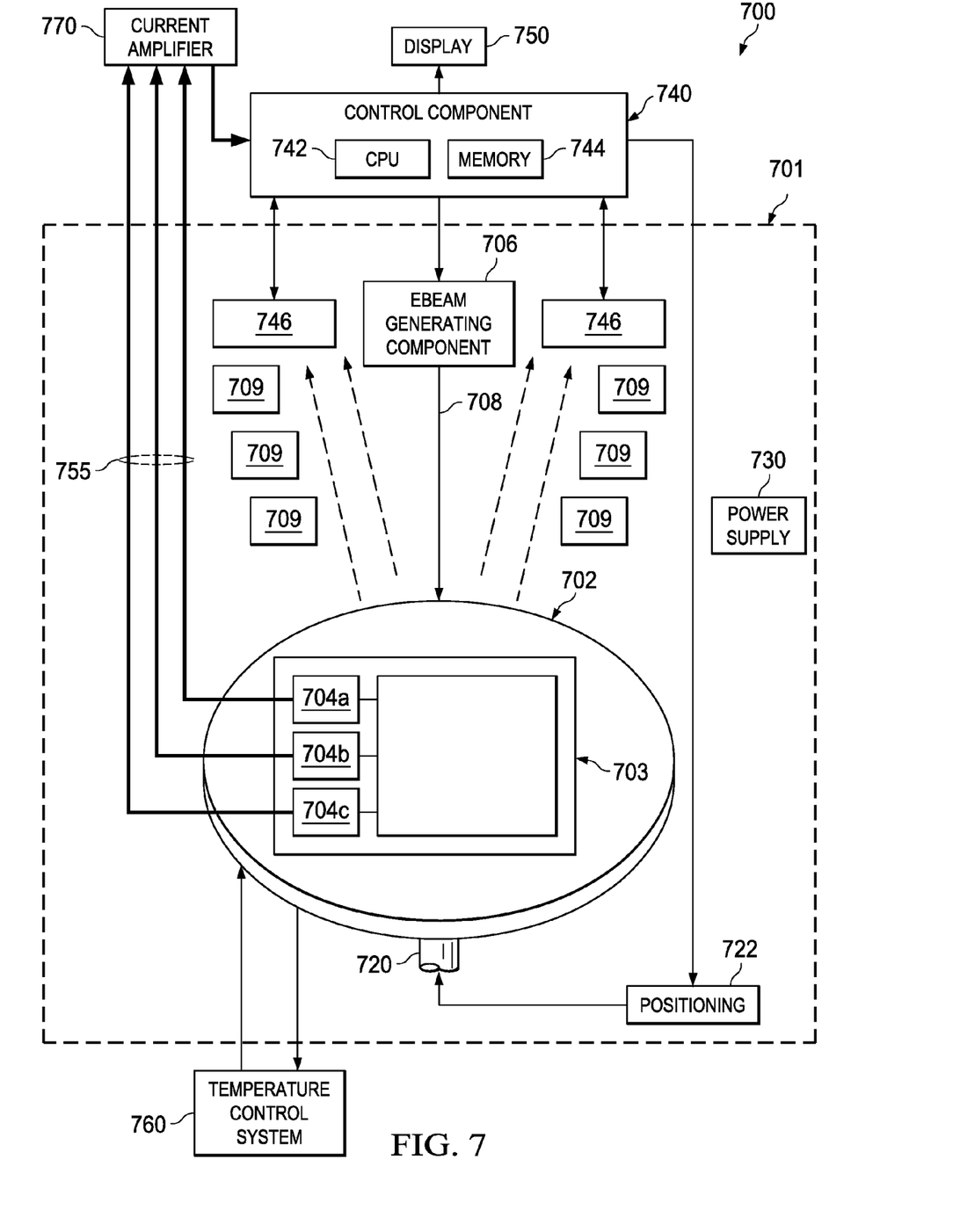
FIG. 7 is a schematic view of an exemplary system for detecting and identifying defects in integrated circuits according to embodiments of the present invention.

FIG. 7 illustrates an exemplary system 700 for performing E-beam inspection of integrated circuits and for detecting electron beam induced currents in integrated circuits. Although only a single system is shown in FIG. 7, it would be apparent to one of ordinary skill in the art that E-beam inspection and EBIC testing can also be performed in separate systems or multi-chamber systems. The system 700 can include a moveable stage 720 in a vacuum chamber 701 for mounting an integrated circuit 702, including a test circuit 703. The moveable stage 720 can be coupled to a positioning component 722 that can move the integrated circuit 702. As previously described, the test circuit 703 can include a plurality of contact pads 704, wherein each of the contact pads 704*a, b, c* can be coupled to the various terminals of the devices in the test circuit 703. In various embodiments, different areas (e.g. die) of the integrated circuit 702 can include test circuits, therefore the beam 708 can be directed at a portion of the integrated circuit 702 including a test circuit 704 to monitor electron beam induced currents.

For EBIC testing, the system 700 can further include a cooling system 760 for adjusting a temperature of the integrated circuit 702 during EBIC testing. For example, the stage 720 can be configured to operate with the temperature control system 760 to control the temperature of the stage 720 and therefore that of the integrated circuit 702 mounted thereon. The system 700 can also include a plurality of probes 755 to contact the pads 704 on the integrated circuit 702. The probes 755 can be coupled through vacuum feed-throughs to a current sensor/amplifier.

The system 700 can also include an electron beam microscope, disposed to direct an E-beam 708 at the integrated 702 for producing either a passive voltage contrast image thereof or for generating and monitoring electron beam induced currents. One of ordinary skill in the art would know that in a voltage contrast image, various features emit electrons from their surface differently, thereby showing different contrast levels (gray level values, GLV) if they are charged differently. In various embodiments, the electron beam microscope can include one or more guide components 709, such as, for example, electromagnets for containing the E-beam 708, directing the E-beam 708 towards the semiconductor work piece 702, and scanning the E-beam 708 across a portion of the semiconductor work piece 702. In some embodiments, the guide components 709 can focus the E-beam 708 to a size of from about 5 nm to about 2000 nm. In various embodiments, the E-beam 708 can be directed at different locations of the test circuit 703 by moving one or both of the integrated circuit 702 or the E-beam 708 relative to one another. In embodiments using EBIC inspection techniques with conventional E-beam scans, the same beam conditions can be used for both steps. However, in some embodiments, a smaller E-beam size can be used during EBIC inspection. Typically, large beam sizes are used in E-beam inspection to allow a faster scan of a wafer. In EBIC inspection, however, a more limited area is being scanned, allowing a smaller beam and slower scan to be used. Additionally, the reduced beam size can permit the localization of defects within a specific device, or portion thereof, in the test circuit.

The term "component" as used herein is intended to include computer related entities, including one or more hardware devices, one or more software programs, a combination of one or more hardware devices and software programs, and software in execution. For example, a component may be a process running on a processor, a processor, an object, an executable, a thread of execution, a program, a computer, or any combination thereof. Both an application program running on a server and the server can be components.

The system 700 can also include one or more power supplies 730. In some embodiments, the power supply 730 can provide high voltage to the E-beam generating component 706. In other embodiments, the power supply 730 can provide bias to the stage 720 to further attract the E-beam 708 towards the semiconductor work piece 702. In some other embodiments, the guide components 709 can be powered by the power supply to direct, contain and/or scan the E-beam 708.

The system 700 can also include a detector 746 to detect electrons emitted from the surface of the semiconductor test structure 702. As a result of the E-beam 708 striking the semiconductor work piece 702, secondary electrons (SE), back scattered electrons (BSE) as well as other electrons, and photons are emitted out of the surface of the semiconductor work piece 702 and detected by the detector 746. The detector 746 can be biased accordingly by the power supply 730 to attract or repel electrons. The voltage used for attracting or repelling secondary electrons and back scattered electrons is referred to as a "charge control voltage". In some embodiments, the charge control voltage can be from about minus 300 Volts to about plus 2000 Volts.

The system 700 can also include an electronic control component 740. The electronic control unit 740 can be configured in any suitable manner to control and operate the various components of the system 700. The electronic control component 740 can include a processor 742, such as, for example, a microprocessor or CPU coupled to a memory 744. One of ordinary skill in the art would know that the processor can be programmed to carry out a variety of functions, including, but not limited to, controlling and operating various components of the system 700. The memory 744 can be used to store, among other things, one or more program codes to be executed by the processor 742 during E-beam inspection or EBIC testing. The memory 744 can include one or more read only memory (ROM) and random access memory (RAM). The ROM can include, among other codes, a Basic Input-Output System (BIOS) which can control the basic hardware operations of the system 700. The RAM can be the main memory and can include operating system and one or more application programs. The memory 744 can also be used as a temporary storage medium for storing information, such as, for example, tabulated data and algorithms. In some embodiments, the memory 744 can include a hard disk drive for mass data storage.

The control component 740 can receive signals from the detector 746 indicative of the electrons emitted from the wafer 702. These signals can then be used by the control component 740 to generate respective gray level values (GLV) for each of the scanned semiconductor work piece 702 location, where the brightness of a GLV for a particular location is a function of the number of electrons emitted from that location. In general, the higher the number of electrons emitted from a location and detected by the detector 746, the higher or brighter the corresponding GLV.

In an exemplary E-beam inspection, the incident E-beam 708 can cause more electrons to be emitted than actually reach the detector 746, thereby inducing a positive charge on the surface of the semiconductor test structure 702. The positive surface potential can inhibit secondary electrons with low kinetic energy from leaving the surface, which in turn can cause fewer electrons to be detected by the detector 746. As a result, the resulting images can look dark or have low GLV relative to surrounding areas. However, the positive surface potential can be neutralized by electrons from lower regions in the substrate, so that the secondary electrons with low kinetic energy can escape and be detected by the detector 746.

The control component 740 can also receive signals form the current amplifier/sensor 770. These signals can be used by the control component to determine electron beam induced currents and identify portions of the test circuit 703 that may include one or more defects, as previously discussed. The control component can also correlate the locations identified by E-beam inspections and EBIC testing.

In various embodiments, current leakage paths can be due to dislocations, pipes, or other defects. Other defects can include, but are not limited to, precipitates in a semiconductor comprising layer or other types of structural defects and formations in a semiconductor comprising layer. The terms "pipe" and "dislocation pipe" as used herein refer to a dislocation with metal and/or metal derivatives in it. In various embodiments, metals and/or metal derivatives in the dislocation pipe can include, but are not limited to nickel, titanium, cobalt, platinum, and their silicides. The metal in the dislocation pipe can provide a pathway for electrons to migrate to the surface of the semiconductor test structure 702 to neutralize the accumulated positive charge. With the surface positive charge neutralized, more electrons can leave the surface of the test structure 702 and be detected by the detector 746, thereby yielding a brighter GLV. In various embodiments, in order to detect current leakage paths, the E-beam 708 can have a landing energy from about 1 Volt to about 1,500 Volts, wherein the landing energy can be controlled by regulating the total bias between the E-beam generating component 706 and the integrated circuit 702 and/or stage 720. In some embodiments, the E-beam 708 current can be from about 1 nA to about 3000 nA, wherein the E-beam 708 current can be a function of an excitation voltage applied to the E-beam generating component 706 as well as the composition and/or composition of gases imparted into the E-beam generating component 706 among other things.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A semiconductor device, comprising:
   a semiconductor substrate;
   an application circuit and one or more test circuits formed on or in the substrate, the test circuits and the application circuit being electrically isolated from each other,
   wherein each test circuit comprises:
   a plurality of MOSFET transistors connected in parallel;
   the plurality of MOSFET transistors comprising alternating sources and drains arranged serially along a first direction in an elongated first common active region of the substrate; gate electrodes formed over the first common active region at positions respectively separating the sources and drains and elongated in second directions generally orthogonal to the first direction; an elongated second common active region of the substrate spaced from and generally parallel to and coextensive with the first common active region; and substrate active region extensions extending from respective each one of one of the sources or drains of the first common active region to the second common active region in third directions generally orthogonal to the first direction;

a first contact pad commonly coupled to each gate electrode;

a second contact pad commonly coupled to respective substrate terminals locally associated with each transistor; and a third contact pad commonly coupled to each one of the other of the sources and drains of the first common active region;

wherein the test circuit comprises one or more stress increasing design features not present in the application circuit.

2. The device of claim 1, wherein the one or more stress increasing design features comprise the dimensioning and configuration of the second common active region and substrate active region extensions.

3. The device of claim 2, wherein each test circuit further comprises a common gate conductor region; and the first contact pad is coupled to the gate electrodes via the common gate conductor region.

4. The device of claim 3, wherein the gate conductor region is formed on a field dielectric in or on the substrate and adjacent to the transistors and is elongated parallel to the first direction, the one or more stress increasing design features comprising at least one of a width of the gate conductor region or a spacing between the gate conductor region and the first common active region.

5. The device of claim 3, wherein each test circuit further comprises a common gate conductor region formed adjacent to the transistors and elongated parallel to the first direction; and the one or more stress increasing design features further comprise at least one of a width of the gate conductor region or a spacing between the gate conductor region and the first common active region.

6. The device of claim 5, wherein the one or more stress increasing design features further comprise closeness of spacing of the gate electrodes in the first direction.

7. The device of claim 6, wherein the one or more stress increasing design features further comprise closeness of spacing of the substrate active region extensions in the first direction.

8. The device of claim 7, wherein the one or more stress increasing design features further comprise deviations from minimum spacing allowed by operational circuit design rules.

9. The device of claim 2, wherein the second contact pad is coupled to respective ones of a plurality of substrate body contacts located less than 500 um from the first common active region.

10. The device of claim 2, further comprising a source/drain contact formed at each one of the other of the sources and drains; and wherein the third contact pad is commonly coupled to each one of the other of the sources and drains via the source/drain contacts.

11. The device of claim 2, further comprising a probe pad active region connecting an end of the second common active region.

12. The device of claim 11, wherein the probe pad active region is elongated in a direction generally orthogonal to the first direction, and extends from the second common active region, past an end of the first common active region, to a position adjacent an end of the gate conductor region.

13. The device of claim 2, wherein each test circuit further comprises a common gate conductor region formed adjacent to the transistors and elongated parallel to the first direction; and the provided one or more stress increasing design features comprise at least one of a width of the gate conductor region or a spacing between the gate conductor region and the first common active region.

14. The device of claim 2, wherein the one or more stress increasing design features comprise closeness of spacing of the gate electrodes in the first direction.

15. The device of claim 2, wherein the one or more stress increasing design features comprise closeness of spacing of the substrate active region extensions in the first direction.

16. The device of claim 2, wherein the one or more stress increasing design features comprise deviations from minimum spacing allowed by operational circuit design rules.

17. The device of claim 12, wherein the device is an integrated circuit including the application circuit and one or more test circuits on a single die.

* * * * *